(12) United States Patent
Sellars et al.

(10) Patent No.: US 12,193,198 B2
(45) Date of Patent: Jan. 7, 2025

(54) PROPULSION SYSTEM COMPRISING A HEAT EXCHANGER

(71) Applicant: ROLLS-ROYCE plc, London (GB)

(72) Inventors: Daniel J Sellars, Bristol (GB); Alec R Groom, Caldicot (GB)

(73) Assignee: ROLLS-ROYCE plc, London (GB)

( * ) Notice: Subject to any disclaimer, the term of this patent is extended or adjusted under 35 U.S.C. 154(b) by 5 days.

(21) Appl. No.: 18/512,190

(22) Filed: Nov. 17, 2023

(65) Prior Publication Data

US 2024/0196574 A1    Jun. 13, 2024

(30) Foreign Application Priority Data

Dec. 9, 2022   (GB) ..................................... 2218535

(51) Int. Cl.
*H05K 7/20*   (2006.01)
*F01D 25/12*   (2006.01)

(52) U.S. Cl.
CPC ......... *H05K 7/20845* (2013.01); *F01D 25/12* (2013.01); *F05D 2260/20* (2013.01)

(58) Field of Classification Search
CPC . H05K 7/20845; F01D 25/12; F05D 2260/20; F05D 2260/98; F02C 7/14; F02K 3/115
See application file for complete search history.

(56) References Cited

U.S. PATENT DOCUMENTS

| | | |
|---|---|---|
| 2012/0114467 A1 | 5/2012 | Elder |
| 2016/0108814 A1 * | 4/2016 | Schmitz ................. B23P 15/26 60/39.511 |
| 2016/0230595 A1 * | 8/2016 | Wong ........................ F28F 3/04 |
| 2016/0231068 A1 * | 8/2016 | Schmitz .................... F28F 9/02 |
| 2018/0171871 A1 | 6/2018 | Duong et al. |
| 2019/0204010 A1 | 7/2019 | Breeze-Stringfellow et al. |

(Continued)

FOREIGN PATENT DOCUMENTS

| | | |
|---|---|---|
| EP | 3 012 443 A1 | 4/2016 |
| EP | 3 054 254 A1 | 8/2016 |

(Continued)

OTHER PUBLICATIONS

May 31, 2023 Combined Search and Examination Report issued in British Patent Application No. GB2218535.9.

(Continued)

*Primary Examiner* — Courtney D Heinle
*Assistant Examiner* — Andrew Thanh Bui
(74) *Attorney, Agent, or Firm* — Oliff PLC

(57) ABSTRACT

A propulsion system having an axial direction relating to a principal direction of propulsion, and a height direction perpendicular to the axial direction. The propulsion system includes a duct configured to convey a flow of fluid along the axial direction, and a heat exchanger disposed within the duct. The heat exchanger is defined between an inlet face and an outlet face and is configured to convey the flow of fluid from the inlet face to the outlet face. A heat exchanger length is defined as a minimum distance between the inlet face and the outlet face and wherein the heat exchanger length varies along the height direction such that a resistance to the flow of fluid through the heat exchanger varies along the height direction.

11 Claims, 6 Drawing Sheets

(56) References Cited

U.S. PATENT DOCUMENTS

2020/0300164 A1* 9/2020 Muldoon ............... B64D 13/08
2022/0205390 A1   6/2022 Toubiana et al.

FOREIGN PATENT DOCUMENTS

| EP | 3 712 404 A1 | 9/2020 |
| FR | 3 074 532 A1 | 6/2019 |
| WO | 2020/234525 A2 | 11/2020 |
| WO | 2020/234525 A3 | 11/2020 |

OTHER PUBLICATIONS

Apr. 8, 2024 Office Action issued in European Patent Application No. 23208965.6.

* cited by examiner

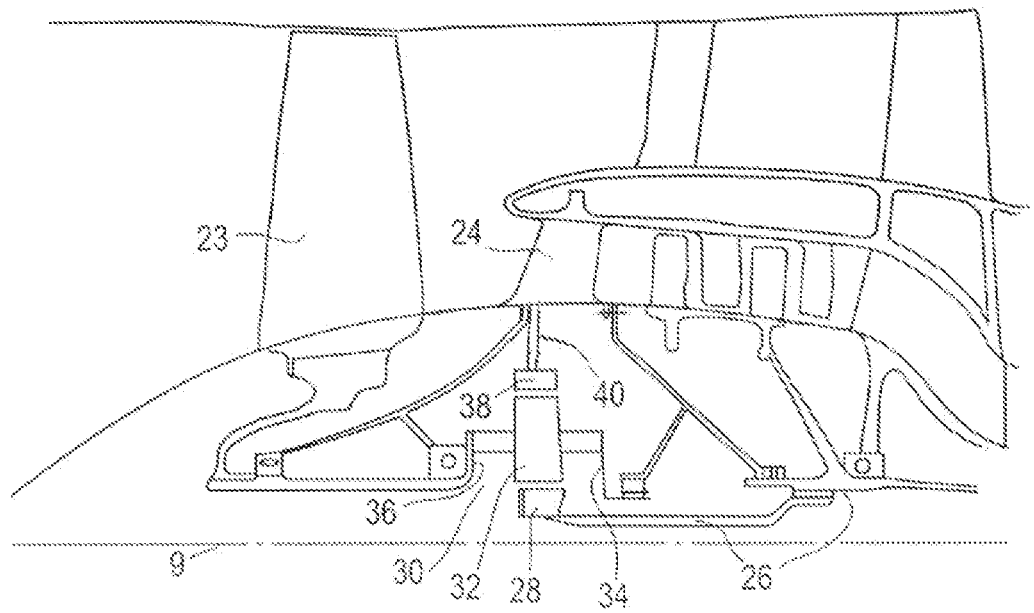
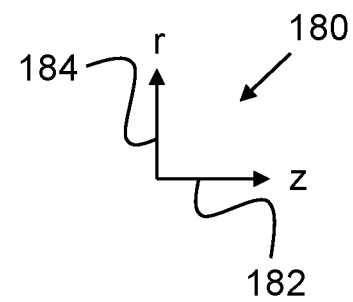
FIG. 3

PROPULSION SYSTEM COMPRISING A HEAT EXCHANGER

This disclosure claims the benefit of UK Patent Application No. GB 2218535.9, filed on Dec. 9, 2022, which is hereby incorporated herein in its entirety.

FIELD OF THE DISCLOSURE

The present disclosure relates to a propulsion system. The propulsion system may be a gas turbine engine and/or may include an electric motor.

BACKGROUND

Heat exchanger assemblies are known to be used in propulsion systems for transferring heat or cooling components of a propulsion system (e.g. a gas turbine engine). Large heat exchangers which use air as a heat sink may be particularly useful for this purpose. However, such large air heat exchangers are typically an architecturally defining component in propulsion systems, and can result in an increased drag penalty (e.g. an increased drag coefficient) of a propulsion system in which they are incorporated.

SUMMARY

According to a first aspect of the present disclosure, there is provided a propulsion system having an axial direction relating to a principal direction of propulsion, and a height direction perpendicular to the axial direction, the propulsion system comprising: a duct configured to convey a flow of fluid along the axial direction; and a heat exchanger disposed within the duct, wherein the heat exchanger is defined between an inlet face and an outlet face and is configured to convey the flow of fluid from the inlet face to the outlet face; wherein a heat exchanger length is defined as a minimum distance between the inlet face and the outlet face, and wherein the heat exchanger length varies along the height direction such that a resistance to the flow of fluid through the heat exchanger varies along the height direction.

It may be that the propulsion system has a rotational axis which is substantially parallel to the axial direction, and a radial direction corresponding to the height direction in any given cross-section of the propulsion system, the radial direction being perpendicular to the rotational axis.

It may be that the resistance to the flow of fluid through the heat exchanger varies along the height direction such that, when a flow of fluid is conveyed by the duct, a difference between a static pressure of the flow of fluid at the inlet face and a static pressure of the flow of fluid at the outlet face varies along the height direction. It may be that the static pressure of the flow of fluid at the outlet face of the heat exchanger is substantially the same along the height direction.

A normal to an inlet plane which is tangential to the inlet face may have a component in the height direction. The inlet face may be planar. A normal to an outlet plane which is tangential to the outlet face may have a component in the height direction. The outlet face may be planar.

It may be that the inlet face is inclined with respect to the axial direction to reduce a heat exchanger radial height. It may be that the outlet face is inclined with respect to the axial direction.

It may be that the duct comprises a top wall and a bottom wall, spaced apart along the height direction, and wherein an axial position of the inlet face varies along the height direction; wherein the heat exchanger length varies along the height direction, in correspondence to the axial position of the inlet face.

It may also be that the inlet face of the heat exchanger is further upstream within the duct at the bottom wall than at the top wall; wherein the heat exchanger length varies along the height direction, with the heat exchanger length being smaller at the bottom wall than at the top wall.

The axial position of the inlet face may vary linearly from the top wall to the bottom wall. It may be that an axial position of the outlet face of the heat exchanger varies along the height direction so that the outlet face is further upstream at the bottom wall than at the top wall.

Otherwise, it may also be that the inlet face of the heat exchanger is further downstream within the duct at the bottom wall than at the top wall; wherein the heat exchanger length varies along the height direction, with the heat exchanger length being longer at the bottom wall than at the top wall.

It may be that an axial position of the outlet face of the heat exchanger varies along the height direction so that the outlet face is further downstream at the bottom wall than at the top wall.

The heat exchanger may comprise a plurality of fins radially offset from one another and extending with a component in the axial direction. A fin density may be defined as a minimum distance between adjacent fins. It may be that the fin density varies along the height direction. Further, it may be that the fin density continually increases along the height direction from the bottom wall to the top wall of the duct. Alternatively, it may be that the fin density continually decreases along the height direction from the bottom wall to the top wall of the duct.

The propulsion system may be a gas turbine engine and/or may include an electric motor. It may be that an inlet of the duct is configured to receive a flow of air from a bypass duct of the gas turbine engine, and wherein the duct is configured to convey the flow of air from the inlet to an outlet, through the heat exchanger.

According to a second aspect of the present disclosure, there is provided an aircraft comprising the propulsion system of the first aspect.

As noted elsewhere herein, the present disclosure may relate to a gas turbine engine. Such a gas turbine engine may comprise an engine core comprising a turbine, a combustor, a compressor, and a core shaft connecting the turbine to the compressor. Such a gas turbine engine may comprise a fan (having fan blades) located upstream of the engine core.

Arrangements of the present disclosure may be particularly, although not exclusively, beneficial for fans that are driven via a gearbox. Accordingly, the gas turbine engine may comprise a gearbox that receives an input from the core shaft and outputs drive to the fan so as to drive the fan at a lower rotational speed than the core shaft. The input to the gearbox may be directly from the core shaft, or indirectly from the core shaft, for example via a spur shaft and/or gear. The core shaft may rigidly connect the turbine and the compressor, such that the turbine and compressor rotate at the same speed (with the fan rotating at a lower speed).

The gas turbine engine as described and/or claimed herein may have any suitable general architecture. For example, the gas turbine engine may have any desired number of shafts that connect turbines and compressors, for example one, two or three shafts. Purely by way of example, the turbine connected to the core shaft may be a first turbine, the compressor connected to the core shaft may be a first compressor, and the core shaft may be a first core shaft. The engine core may further comprise a second turbine, a second compressor, and a second core shaft connecting the second turbine to the second compressor. The second turbine, second compressor, and second core shaft may be arranged to rotate at a higher rotational speed than the first core shaft.

In such an arrangement, the second compressor may be positioned axially downstream of the first compressor. The second compressor may be arranged to receive (for example directly receive, for example via a generally annular duct) flow from the first compressor.

The gearbox may be arranged to be driven by the core shaft that is configured to rotate (for example in use) at the lowest rotational speed (for example the first core shaft in the example above). For example, the gearbox may be arranged to be driven only by the core shaft that is configured to rotate (for example in use) at the lowest rotational speed (for example only by the first core shaft, and not the second core shaft, in the example above). Alternatively, the gearbox may be arranged to be driven by any one or more shafts, for example the first and/or second shafts in the example above.

The gearbox may be a reduction gearbox (in that the output to the fan is a lower rotational rate than the input from the core shaft). Any type of gearbox may be used. For example, the gearbox may be a "planetary" or "star" gearbox, as described in more detail elsewhere herein. The gearbox may have any desired reduction ratio (defined as the rotational speed of the input shaft divided by the rotational speed of the output shaft), for example greater than 2.5, for example in the range of from 3 to 4.2, or 3.2 to 3.8, for example on the order of or at least 3, 3.1, 3.2, 3.3, 3.4, 3.5, 3.6, 3.7, 3.8, 3.9, 4, 4.1 or 4.2. The gear ratio may be, for example, between any two of the values in the previous sentence. Purely by way of example, the gearbox may be a "star" gearbox having a ratio in the range of from 3.1 or 3.2 to 3.8. In some arrangements, the gear ratio may be outside these ranges.

In any gas turbine engine as described and/or claimed herein, a combustor may be provided axially downstream of the fan and compressor(s). For example, the combustor may be directly downstream of (for example at the exit of) the second compressor, where a second compressor is provided. By way of further example, the flow at the exit to the combustor may be provided to the inlet of the second turbine, where a second turbine is provided. The combustor may be provided upstream of the turbine(s).

The or each compressor (for example the first compressor and second compressor as described above) may comprise any number of stages, for example multiple stages. Each stage may comprise a row of rotor blades and a row of stator vanes, which may be variable stator vanes (in that their angle of incidence may be variable). The row of rotor blades and the row of stator vanes may be axially offset from each other.

The or each turbine (for example the first turbine and second turbine as described above) may comprise any number of stages, for example multiple stages. Each stage may comprise a row of rotor blades and a row of stator vanes. The row of rotor blades and the row of stator vanes may be axially offset from each other.

Each fan blade may be defined as having a radial span extending from a root (or hub) at a radially inner gas-washed location, or 0% span position, to a tip at a 100% span position. The ratio of the radius of the fan blade at the hub to the radius of the fan blade at the tip may be less than (or on the order of) any of: 0.4, 0.39, 0.38, 0.37, 0.36, 0.35, 0.34, 0.33, 0.32, 0.31, 0.3, 0.29, 0.28, 0.27, 0.26, or 0.25. The ratio of the radius of the fan blade at the hub to the radius of the fan blade at the tip may be in an inclusive range bounded by any two of the values in the previous sentence (i.e. the values may form upper or lower bounds), for example in the range of from 0.28 to 0.32. These ratios may commonly be referred to as the hub-to-tip ratio. The radius at the hub and the radius at the tip may both be measured at the leading edge (or axially forwardmost) part of the blade. The hub-to-tip ratio refers, of course, to the gas-washed portion of the fan blade, i.e. the portion radially outside any platform.

The radius of the fan may be measured between the engine centreline and the tip of a fan blade at its leading edge. The fan diameter (which may simply be twice the radius of the fan) may be greater than (or on the order of) any of: 210 cm, 220 cm, 230 cm, 240 cm, 250 cm (around 100 inches), 260 cm, 270 cm (around 105 inches), 280 cm (around 110 inches), 290 cm (around 115 inches), 300 cm (around 120 inches), 310 cm, 320 cm (around 125 inches), 330 cm (around 130 inches), 340 cm (around 135 inches), 350 cm, 360 cm (around 140 inches), 370 cm (around 145 inches), 380 cm (around 150 inches), 390 cm (around 155 inches), 400 cm, 410 cm (around 160 inches) or 420 cm (around 165 inches). The fan diameter may be in an inclusive range bounded by any two of the values in the previous sentence (i.e. the values may form upper or lower bounds), for example in the range of from 210 cm to 240 cm, or 250 cm to 280 cm, or 320 cm to 380 cm.

The rotational speed of the fan may vary in use. Generally, the rotational speed is lower for fans with a higher diameter. Purely by way of non-limitative example, the rotational speed of the fan at cruise conditions may be less than 2600 rpm, for example less than 2500 rpm, or less than 2300 rpm. Purely by way of further non-limitative example, the rotational speed of the fan at cruise conditions for an engine having a fan diameter in the range of from 210 cm to 300 cm (for example 240 cm to 280 cm or 250 cm to 270 cm) may be in the range of from 1700 rpm to 2600 rpm, for example in the range of from 1800 rpm to 2300 rpm, for example in the range of from 1900 rpm to 2100 rpm. Purely by way of further non-limitative example, the rotational speed of the fan at cruise conditions for an engine having a fan diameter in the range of from 330 cm to 380 cm may be in the range of from 1200 rpm to 2000 rpm, for example in the range of from 1300 rpm to 1800 rpm, for example in the range of from 1400 rpm to 1800 rpm.

In use of the gas turbine engine, the fan (with associated fan blades) rotates about a rotational axis. This rotation results in the tip of the fan blade moving with a velocity Utip. The work done by the fan blades 13 on the flow results in an enthalpy rise dH of the flow. A fan tip loading may be defined as dH/Utip2, where dH is the enthalpy rise (for example the 1-D average enthalpy rise) across the fan and Utip is the (translational) velocity of the fan tip, for example at the leading edge of the tip (which may be defined as fan tip radius at leading edge multiplied by angular speed). The fan tip loading at cruise conditions may be greater than (or on the order of) any of: 0.28, 0.29, 0.30, 0.31, 0.32, 0.33, 0.34, 0.35, 0.36, 0.37, 0.38, 0.39 or 0.4 (all values being dimensionless). The fan tip loading may be in an inclusive range bounded by any two of the values in the previous sentence (i.e., the values may form upper or lower bounds), for example in the range of from 0.28 to 0.31, or 0.29 to 0.3.

Gas turbine engines in accordance with the present disclosure may have any desired bypass ratio, where the bypass ratio is defined as the ratio of the mass flow rate of the flow through the bypass duct to the mass flow rate of the flow through the core at cruise conditions. In some arrangements the bypass ratio may be greater than (or on the order of) any of the following: 10, 10.5, 11, 11.5, 12, 12.5, 13, 13.5, 14, 14.5, 15, 15.5, 16, 16.5, 17, 17.5, 18, 18.5, 19, 19.5 or 20. The bypass ratio may be in an inclusive range bounded by any two of the values in the previous sentence (i.e. the values may form upper or lower bounds), for example in the range of form 12 to 16, 13 to 15, or 13 to 14. The bypass duct may be substantially annular. The bypass duct may be radially outside the core engine. The radially outer surface of the bypass duct may be defined by a nacelle and/or a fan case.

The overall pressure ratio of a gas turbine engine as described and/or claimed herein may be defined as the ratio of the stagnation pressure upstream of the fan to the stagnation pressure at the exit of the highest-pressure compressor (before entry into the combustor). By way of non-limitative example, the overall pressure ratio of a gas turbine engine as described and/or claimed herein at cruise may be greater than (or on the order of) any of the following: 35, 40, 45, 50, 55, 60, 65, 70, 75. The overall pressure ratio may be in an inclusive range bounded by any two of the values in the previous sentence (i.e. the values may form upper or lower bounds), for example in the range of from 50 to 70.

Specific thrust of an engine may be defined as the net thrust of the engine divided by the total mass flow through the engine. At cruise conditions, the specific thrust of an engine described and/or claimed herein may be less than (or on the order of) any of the following: 110 Nkg-1s, 105 Nkg-1s, 100 Nkg-1s, 95 Nkg-1s, 90 Nkg-1s, 85 Nkg-1s or 80 Nkg-1s. The specific thrust may be in an inclusive range bounded by any two of the values in the previous sentence (i.e. the values may form upper or lower bounds), for example in the range of from 80 Nkg-1s to 100 Nkg-1s, or 85 Nkg-1s to 95 Nkg-1s. Such engines may be particularly efficient in comparison with conventional gas turbine engines.

A gas turbine engine as described and/or claimed herein may have any desired maximum thrust. Purely by way of non-limitative example, a gas turbine as described and/or claimed herein may be capable of producing a maximum thrust of at least (or on the order of) any of the following: 130 kN, 135 kN, 140 kN, 145 kN, 150 kN, 155 kN, 160 kN, 170 kN, 180 kN, 190 kN, 200 kN, 250 kN, 300 kN, 350 kN, 400 kN, 450 kN, 500 kN, or 550 kN. The maximum thrust may be in an inclusive range bounded by any two of the values in the previous sentence (i.e. the values may form upper or lower bounds). Purely by way of example, a gas turbine as described and/or claimed herein may be capable of producing a maximum thrust in the range of from 155 kN to 170 kN, 330 kN to 420 kN, or 350 kN to 400 kN. The thrust referred to above may be the maximum net thrust at standard atmospheric conditions at sea level plus 15 degrees C. (ambient pressure 101.3 kPa, temperature 30 degrees C.), with the engine static.

In use, the temperature of the flow at the entry to the high-pressure turbine may be particularly high. This temperature, which may be referred to as TET, may be measured at the exit to the combustor, for example immediately upstream of the first turbine vane, which itself may be referred to as a nozzle guide vane. At cruise, the TET may be at least (or on the order of) any of the following: 1400K, 1450K, 1500K, 1520K, 1530K, 1540K, 1550K, 1600K or 1650K. The TET at cruise may be in an inclusive range bounded by any two of the values in the previous sentence (i.e., the values may form upper or lower bounds), for example 1530K to 1600K. The maximum TET in use of the engine may be, for example, at least (or on the order of) any of the following: 1700K, 1750K, 1800K, 1850K, 1900K, 1950K or 2000K. The maximum TET may be in an inclusive range bounded by any two of the values in the previous sentence (i.e., the values may form upper or lower bounds), for example in the range of from 1800K to 1950K, or 1900K to 2000K. The maximum TET may occur, for example, at a high thrust condition, for example at a maximum take-off (MTO) condition.

A fan blade and/or aerofoil portion of a fan blade described and/or claimed herein may be manufactured from any suitable material or combination of materials. For example at least a part of the fan blade and/or aerofoil may be manufactured at least in part from a composite, for example a metal matrix composite and/or an organic matrix composite, such as carbon fibre. By way of further example at least a part of the fan blade and/or aerofoil may be manufactured at least in part from a metal, such as a titanium based metal or an aluminium based material (such as an aluminium-lithium alloy) or a steel based material. The fan blade may comprise at least two regions manufactured using different materials. For example, the fan blade may have a protective leading edge, which may be manufactured using a material that is better able to resist impact (for example from birds, ice or other material) than the rest of the blade. Such a leading edge may, for example, be manufactured using titanium or a titanium-based alloy. Thus, purely by way of example, the fan blade may have a carbon-fibre or aluminium based body (such as an aluminium lithium alloy) with a titanium leading edge.

A fan as described and/or claimed herein may comprise a central portion, from which the fan blades may extend, for example in a radial direction. The fan blades may be attached to the central portion in any desired manner. For example, each fan blade may comprise a fixture which may engage a corresponding slot in the hub (or disc). Purely by way of example, such a fixture may be in the form of a dovetail that may slot into and/or engage a corresponding slot in the hub/disc in order to fix the fan blade to the hub/disc. By way of further example, the fan blades maybe formed integrally with a central portion. Such an arrangement may be referred to as a bladed disc or a bladed ring. Any suitable method may be used to manufacture such a bladed disc or bladed ring. For example, at least a part of the fan blades may be machined from a block and/or at least part of the fan blades may be attached to the hub/disc by welding, such as linear friction welding.

The gas turbine engines described and/or claimed herein may or may not be provided with a variable area nozzle (VAN). Such a variable area nozzle may allow the exit area of the bypass duct to be varied in use. The general principles of the present disclosure may apply to engines with or without a VAN. The fan of a gas turbine as described and/or claimed herein may have any desired number of fan blades, for example 14, 16, 18, 20, 22, 24 or 26 fan blades.

As used herein, cruise conditions have the conventional meaning and would be readily understood by the skilled person. Thus, for a given gas turbine engine for an aircraft, the skilled person would immediately recognise cruise conditions to mean the operating point of the engine at mid-cruise of a given mission (which may be referred to in the industry as the "economic mission") of an aircraft to which the gas turbine engine is designed to be attached. In this regard, mid-cruise is the point in an aircraft flight cycle at which 50% of the total fuel that is burned between top of climb and start of descent has been burned (which may be approximated by the midpoint—in terms of time and/or distance—between top of climb and start of descent). Cruise conditions thus define an operating point of the gas turbine engine that provides a thrust that would ensure steady state operation (i.e. maintaining a constant altitude and constant Mach Number) at mid-cruise of an aircraft to which it is designed to be attached, taking into account the number of engines provided to that aircraft. For example where an engine is designed to be attached to an aircraft that has two engines of the same type, at cruise conditions the engine provides half of the total thrust that would be required for steady state operation of that aircraft at mid-cruise.

In other words, for a given gas turbine engine for an aircraft, cruise conditions are defined as the operating point of the engine that provides a specified thrust (required to provide—in combination with any other engines on the aircraft—steady state operation of the aircraft to which it is designed to be attached at a given mid-cruise Mach Number) at the mid-cruise atmospheric conditions (defined by the International Standard Atmosphere according to ISO 2533 at the mid-cruise altitude). For any given gas turbine engine for an aircraft, the mid-cruise thrust, atmospheric conditions and Mach Number are known, and thus the operating point of the engine at cruise conditions is clearly defined.

Purely by way of example, the forward speed at the cruise condition may be any point in the range of from Mach 0.7 to 0.9, for example 0.75 to 0.85, for example 0.76 to 0.84, for example 0.77 to 0.83, for example 0.78 to 0.82, for example 0.79 to 0.81, for example on the order of Mach 0.8, on the order of Mach 0.85 or in the range of from 0.8 to 0.85. Any single speed within these ranges may be part of the cruise condition. For some aircraft, the cruise conditions may be outside these ranges, for example below Mach 0.7 or above Mach 0.9.

Purely by way of example, the cruise conditions may correspond to standard atmospheric conditions (according to the International Standard Atmosphere, ISA) at an altitude that is in the range of from 10000 m to 15000 m, for example in the range of from 10000 m to 12000 m, for example in the range of from 10400 m to 11600 m (around 38000 ft), for example in the range of from 10500 m to 11500 m, for example in the range of from 10600 m to 11400 m, for example in the range of from 10700 m (around 35000 ft) to 11300 m, for example in the range of from 10800 m to 11200 m, for example in the range of from 10900 m to 11100 m, for example on the order of 11000 m. The cruise conditions may correspond to standard atmospheric conditions at any given altitude in these ranges.

Purely by way of example, the cruise conditions may correspond to a forward Mach number of 0.8 and standard atmospheric conditions (according to the International Standard Atmosphere) at an altitude of 35000 ft (10668 m). At such cruise conditions, the engine may provide a known required net thrust level. The known required net thrust level is, of course, dependent on the engine and its intended application and may be, for example, a value in the range of from 20 kN to 40 kN.

Purely by way of further example, the cruise conditions may correspond to a forward Mach number of 0.85 and standard atmospheric conditions (according to the International Standard Atmosphere) at an altitude of 38000 ft (11582 m). At such cruise conditions, the engine may provide a known required net thrust level. The known required net thrust level is, of course, dependent on the engine and its intended application and may be, for example, a value in the range of from 35 kN to 65 kN.

In use, a gas turbine engine described and/or claimed herein may operate at the cruise conditions defined elsewhere herein. Such cruise conditions may be determined by the cruise conditions (for example the mid-cruise conditions) of an aircraft to which at least one (for example 2 or 4) gas turbine engine may be mounted in order to provide propulsive thrust.

According to another aspect of the present disclosure, there is provided an aircraft comprising a gas turbine engine as described and/or claimed herein. The aircraft according to this aspect is the aircraft for which the gas turbine engine has been designed to be attached. Accordingly, the cruise conditions according to this aspect correspond to the mid-cruise of the aircraft, as defined elsewhere herein.

According to another aspect of the present disclosure, there is provided a method of operating a gas turbine engine as described and/or claimed herein. The operation may be at the cruise conditions as defined elsewhere herein (for example in terms of the thrust, atmospheric conditions and Mach Number).

According to another aspect of the present disclosure, there is provided a method of operating an aircraft comprising a gas turbine engine as described and/or claimed herein. The operation according to this aspect may include (or may be) operation at the mid-cruise of the aircraft, as defined elsewhere herein.

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example and with reference to the accompanying drawings, in which:

FIG. 3 is a close-up sectional side view of an upstream portion of a gas turbine engine;

DETAILED DESCRIPTION

Aspects and embodiments of the present disclosure will now be discussed with reference to the accompanying figures. Further aspects and embodiments will be apparent to those skilled in the art.

Figure 1:
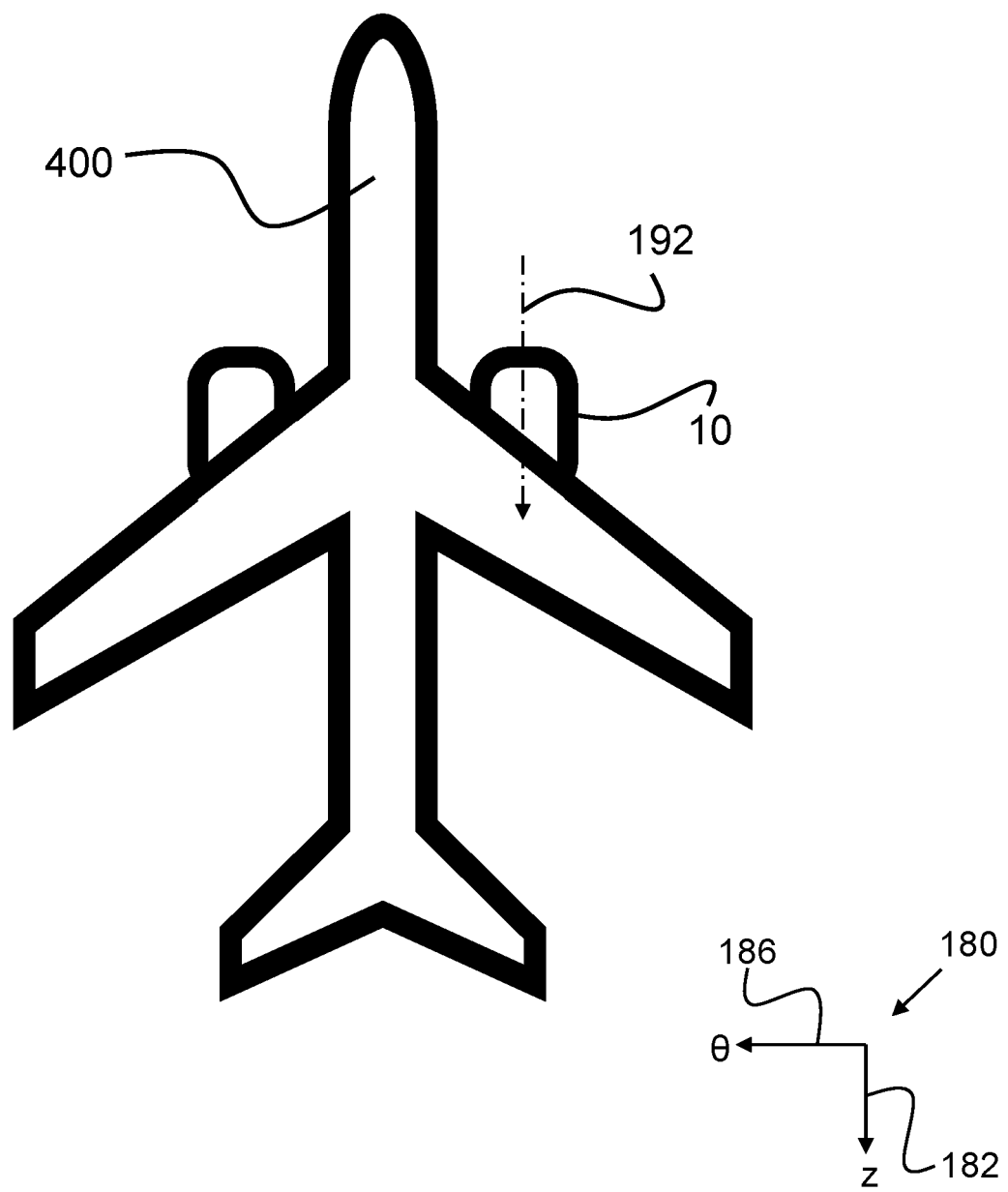
FIG. 1 is a schematic plan view of an aircraft comprising a propulsion system.

FIG. 1 is a schematic plan view of an aircraft 400 comprising a propulsion system 10. In the example aircraft 400, the propulsion system 10 is a ducted fan gas turbine engine 10. However, this disclosure envisages that the propulsion system 10 may not be a ducted fan gas turbine engine 10. By way of example, the propulsion system 10 may be an unducted fan gas turbine engine. The propulsion system 10 may include an electric motor, a fuel-cell (e.g. a hydrogen fuel cell), a hydrogen cycle engine, a reciprocating combustion engine and the like. Further, the aircraft 400 may comprise any number of propulsion systems 10. If the propulsion system 10 is a gas turbine engine 10 which comprises an electric motor, the propulsion system 10 may be referred to as a hybrid-electric gas turbine engine 10.

The propulsion system 10 has a principal direction of propulsion 192. The principal direction of propulsion 192 is an overall direction along which the propulsion system 10 is configured to provide propulsive force (e.g., thrust) in use.

Figure 2:
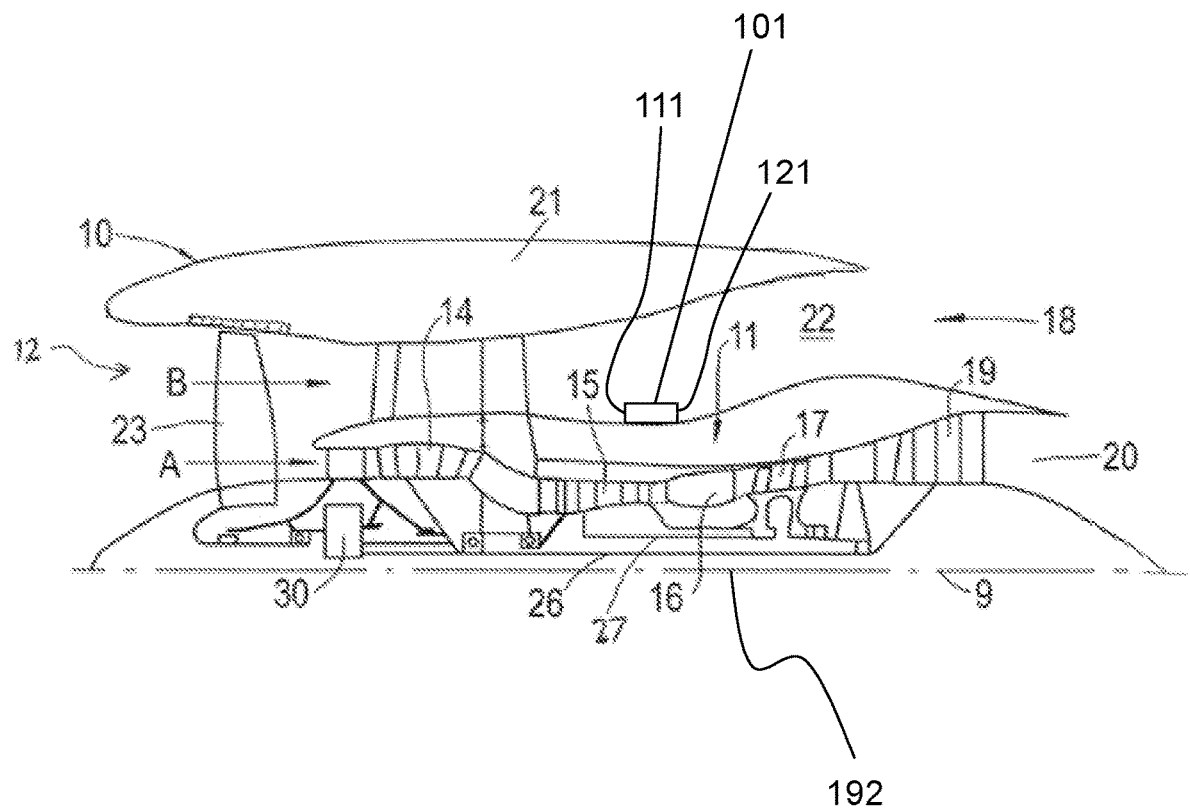
FIG. 2 is a sectional side view of a gas turbine engine comprising a heat exchanger assembly.

FIG. 2 illustrates a gas turbine engine 10 having a principal rotational axis 9. The engine 10 comprises an air intake 12 and a propulsive fan 23 that generates two airflows: a core airflow A and a bypass airflow B. The gas turbine engine 10 comprises a core 11 that receives the core airflow A. The engine core 11 comprises, in axial flow series, a low-pressure compressor 14, a high-pressure compressor 15, combustion equipment 16, a high-pressure turbine 17, a low-pressure turbine 19 and a core exhaust nozzle 20. A nacelle 21 surrounds the gas turbine engine 10 and defines a bypass duct 22 and a bypass exhaust nozzle 18. The bypass airflow B flows through the bypass duct 22. The fan 23 is attached to and driven by the low-pressure turbine 19 via a shaft 26 and an epicyclic gearbox 30.

In use, the core airflow A is accelerated and compressed by the low-pressure compressor 14 and directed into the high-pressure compressor 15 where further compression takes place. The compressed air exhausted from the high-pressure compressor 15 is directed into the combustion equipment 16 where it is mixed with fuel and the mixture is combusted. The resultant hot combustion products then expand through, and thereby drive, the high-pressure and low-pressure turbines 17, 19 before being exhausted through the core exhaust nozzle 20 to provide some propulsive thrust. The high-pressure turbine 17 drives the high-pressure compressor 15 by a suitable interconnecting shaft 27. The fan 23 generally provides the majority of the propulsive thrust. The epicyclic gearbox 30 is a reduction gearbox.

For ease of understanding, each of FIGS. 1 to 3 and 5 to 6 show directions of a cylindrical coordinate system 180 defined with respect to a principal rotational axis 9 of the propulsion system 10. The cylindrical coordinate system 180 includes an axial direction (denoted as z) 182 which is parallel to the principal direction of propulsion 192 in this example, a radial direction (denoted as r) 184 and a tangential or circumferential direction (denoted as e) 186. The rotational axis 9 is substantially parallel to the axial direction 182, whereas the radial direction 184 is perpendicular to the rotational axis 9 (and also perpendicular to the circumferential direction 186). A height direction is defined as corresponding to the radial direction 184. Therefore, the radial direction 184 and the height direction 184 may be referred to interchangeably herein. If the propulsion system is generally cylindrical, the term radial direction 184 may be used to refer to a direction which is substantially perpendicular to the axial direction 182. Conversely, if the propulsion system is generally not cylindrical, the term height direction 184 may instead by used to refer to a direction which is substantially perpendicular to the axial direction 182.

As will be apparent to those skilled in the art, the terms axially, axial, radially, radial, circumferentially, circumferential, tangentially and tangential are defined with respect to the principal rotational axis 9 (and thus, the principal direction of propulsion 192).

The example gas turbine engine 10 shown in FIG. 2 further comprises a heat exchanger assembly 101 disposed annularly around the core 11 and configured to transfer heat generated by the gas turbine engine 10 into the bypass air flow B. In particular, the heat exchanger assembly 101 is disposed radially outward of the core 11 and radially inward of a portion of the bypass duct 22. As shown, the heat exchanger assembly 101 comprises a duct inlet 111 configured to receive a flow of air from the bypass duct 22 and a duct outlet 121 configured to discharge the flow of air into the bypass duct 22 at a location downstream of the duct inlet 111 within the bypass duct. The location of the heat exchanger assembly 101 in FIG. 2 is purely illustrative, and it will be appreciated that the heat exchanger assembly 101 may be disposed within the bypass duct 22 at any suitable location within the gas turbine engine 10.

An exemplary arrangement for a geared fan gas turbine engine 10 is shown in FIG. 3. The low-pressure turbine 19 (see FIG. 2) drives the shaft 26, which is coupled to a sun wheel, or sun gear, 28 of the epicyclic gear arrangement 30. Radially outwardly of the sun gear 28 and intermeshing therewith is a plurality of planet gears 32 that are coupled together by a planet carrier 34. The planet carrier 34 constrains the planet gears 32 to precess around the sun gear 28 in synchronicity whilst enabling each planet gear 32 to rotate about its own axis. The planet carrier 34 is coupled via linkages 36 to the fan 23 in order to drive its rotation about the engine axis 9. Radially outwardly of the planet gears 32 and intermeshing therewith is an annulus or ring gear 38 that is coupled, via linkages 40, to a stationary supporting structure 24.

Note that the terms "low pressure turbine" and "low pressure compressor" as used herein may be taken to mean the lowest pressure turbine stages and lowest pressure compressor stages (i.e., not including the fan 23) respectively and/or the turbine and compressor stages that are connected together by the interconnecting shaft 26 with the lowest rotational speed in the engine (i.e., not including the gearbox output shaft that drives the fan 23). In some literature, the "low pressure turbine" and "low pressure compressor" referred to herein may alternatively be known as the "intermediate pressure turbine" and "intermediate pressure compressor". Where such alternative nomenclature is used, the fan 23 may be referred to as a first, or lowest pressure, compression stage.

Figure 4:
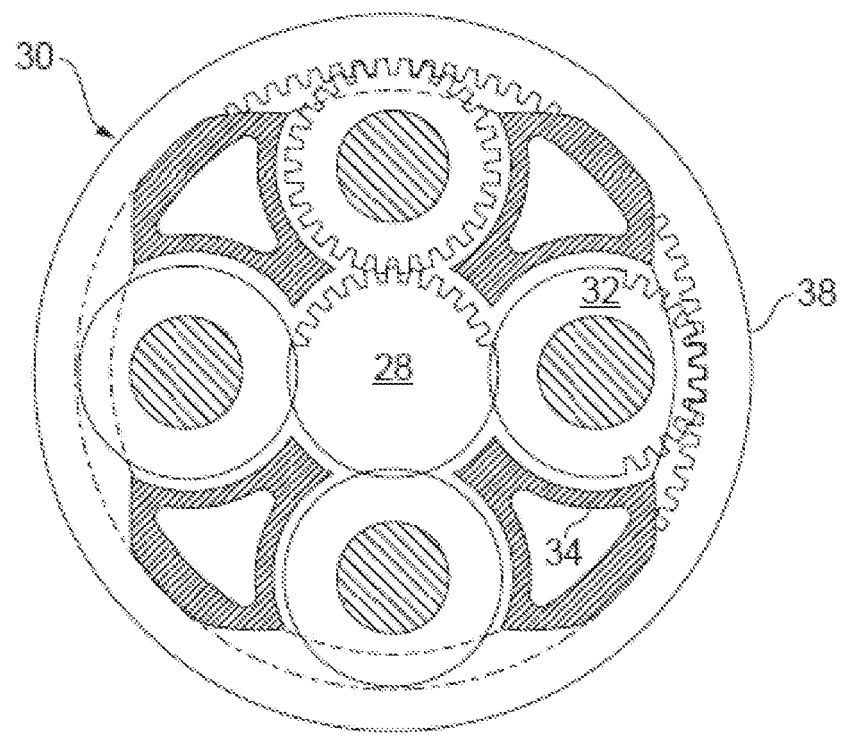
FIG. 4 is a partially cut-away view of a gearbox for a gas turbine engine.

The epicyclic gearbox 30 is shown by way of example in greater detail in FIG. 4. Each of the sun gear 28, planet gears 32 and ring gear 38 comprise teeth about their periphery to intermesh with the other gears. However, for clarity only exemplary portions of the teeth are illustrated in FIG. 4. There are four planet gears 32 illustrated, although it will be apparent to the skilled reader that more or fewer planet gears 32 may be provided within the scope of the claimed disclosure. Practical applications of a planetary epicyclic gearbox 30 generally comprise at least three planet gears 32.

The epicyclic gearbox 30 illustrated by way of example in FIGS. 3 and 4 is of the planetary type, in that the planet carrier 34 is coupled to an output shaft via linkages 36, with the ring gear 38 fixed. However, any other suitable type of epicyclic gearbox 30 may be used. By way of further example, the epicyclic gearbox 30 may be a star arrangement, in which the planet carrier 34 is held fixed, with the ring (or annulus) gear 38 allowed to rotate. In such an arrangement the fan 23 is driven by the ring gear 38. By way of further alternative example, the gearbox 30 may be a differential gearbox in which the ring gear 38 and the planet carrier 34 are both allowed to rotate.

It will be appreciated that the arrangement shown in FIGS. 3 and 4 is by way of example only, and various alternatives are within the scope of the present disclosure. Purely by way of example, any suitable arrangement may be used for locating the gearbox 30 in the engine 10 and/or for connecting the gearbox 30 to the engine 10. By way of further example, the connections (such as the linkages 36, 40 in the FIG. 3 example) between the gearbox 30 and other parts of the engine 10 (such as the input shaft 26, the output shaft and the fixed structure 24) may have any desired degree of stiffness or flexibility. By way of further example, any suitable arrangement of the bearings between rotating and stationary parts of the engine (for example between the input and output shafts from the gearbox and the fixed structures, such as the gearbox casing) may be used, and the disclosure is not limited to the exemplary arrangement of FIG. 3. For example, where the gearbox 30 has a star arrangement (described above), the skilled person would readily understand that the arrangement of output and support linkages and bearing locations would typically be different to that shown by way of example in FIG. 3.

Accordingly, the present disclosure extends to a gas turbine engine having any arrangement of gearbox styles (for example star or planetary), support structures, input and output shaft arrangement, and bearing locations. Optionally, the gearbox may drive additional and/or alternative components (e.g., the intermediate pressure compressor and/or a booster compressor).

Other gas turbine engines to which the present disclosure may be applied may have alternative configurations. For example, such engines may have an alternative number of compressors and/or turbines and/or an alternative number of interconnecting shafts. By way of further example, the gas turbine engine shown in FIG. 2 has a split flow nozzle 18, 20 meaning that the flow through the bypass duct 22 has its own nozzle 18 that is separate to and radially outside the core exhaust nozzle 20. However, this is not limiting, and any aspect of the present disclosure may also apply to engines in which the flow through the bypass duct 22 and the flow through the core 11 are mixed, or combined, before (or upstream of) a single nozzle, which may be referred to as a mixed flow nozzle. One or both nozzles (whether mixed or split flow) may have a fixed or variable area. Whilst the described example relates to a turbofan engine, the disclosure may apply, for example, to any type of gas turbine engine, such as an open rotor (in which the fan stage is not surrounded by a nacelle) or turboprop engine, for example. In some arrangements, the gas turbine engine 10 may not comprise a gearbox 30.

Figure 5:
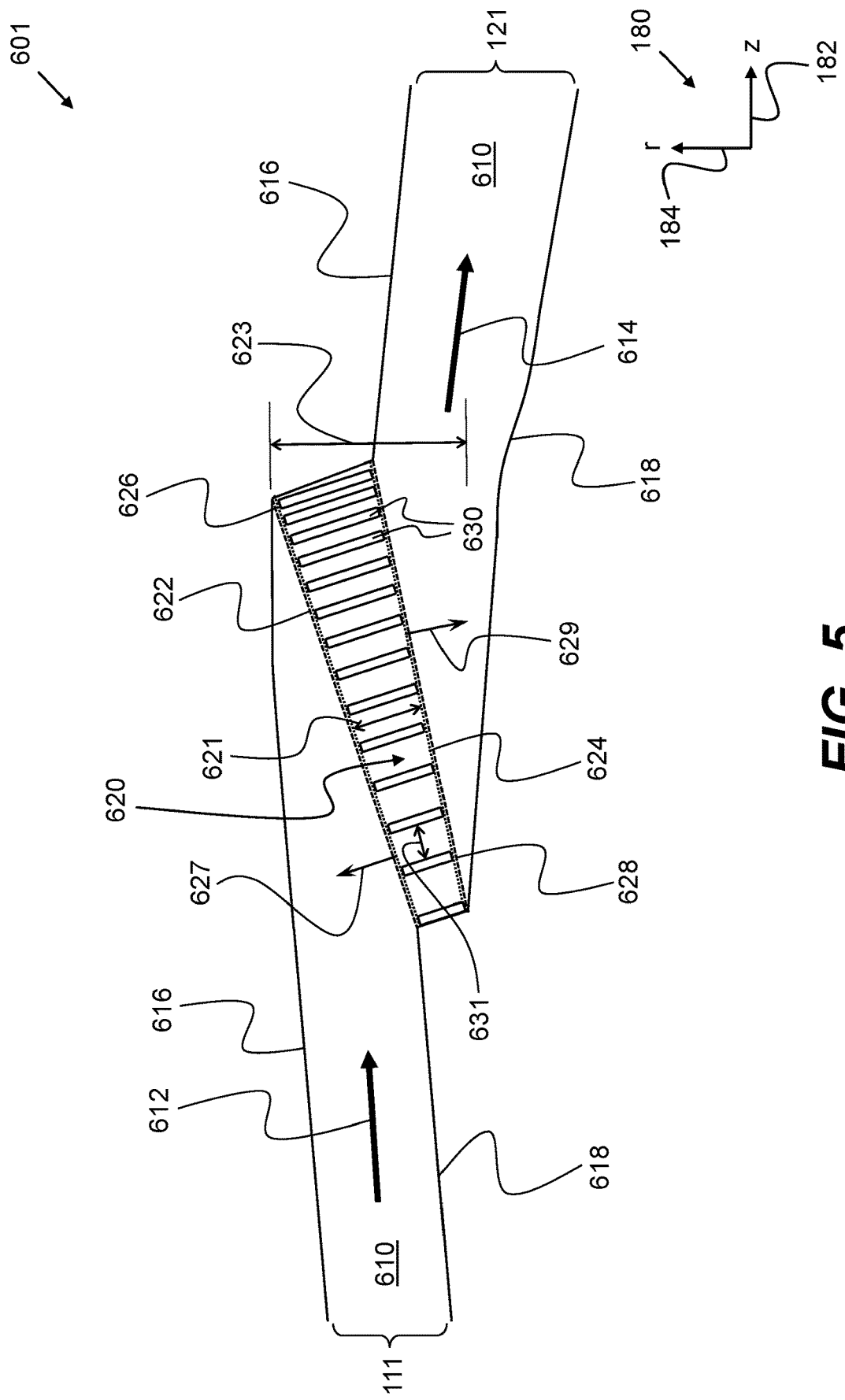
FIG. 5 is a cross-sectional view of a first example heat exchanger assembly.

FIG. 5 is a cross-sectional view of a first example heat exchanger assembly 601 suitable for use within a propulsion system 10 as described herein. The heat exchanger assembly 601 is generally configured to reject heat generated by a propulsion system 10 (which acts as a heat source) into a flow of fluid (which acts as a heat sink) for the purpose of cooling various components of the propulsion system 10.

The heat exchanger assembly 601 comprises a duct 610 in which a heat exchanger 620 is disposed. The duct 610 is generally configured to convey a flow of fluid along the axial direction 182 from the duct inlet 111 to the duct outlet 121 for heat exchange with the heat exchanger 620. To this end, the duct 610 comprises a top wall 616 and a bottom wall 618 spaced apart along the height direction 184 to define a fluid passageway for the flow of fluid therebetween. When incorporated within a propulsion system 10 as described above with reference to FIGS. 2-4, a minimum distance between the bottom wall 618 and the principal rotational axis 9 is smaller than a minimum distance between the top wall 616 and the principal rotational axis 9. In other words, the top wall 616 would be disposed radially outwardly from the bottom wall 618.

The heat exchanger 620 is defined between an inlet face 622 and an outlet face 624. The heat exchanger 620 is configured such that the flow of fluid is received into the heat exchanger 620 at the inlet face 622. Further, the heat exchanger 620 is configured to convey the flow of fluid from the inlet face 622 to the outlet face 624 such that, in use, the flow of fluid exchanges heat with the heat exchanger 620 between the inlet face 622 and the outlet face 624 before being discharged from the heat exchanger 620 at the outlet face 624.

In this example, the duct 610 is configured to receive a flow of air from the bypass duct 22 of the propulsion system 10 via the duct inlet 111 and to discharge the flow of air to the bypass duct 22 of the propulsion system via the duct outlet 121. The flow of air upstream of the heat exchanger 620 (that is, between the duct inlet 111 and the inlet face 622 of the heat exchanger 620) is represented by arrow 612 in FIG. 5, and the flow of air downstream of the heat exchanger 620 (that is, between the outlet face 624 of the heat exchanger 620 and the duct outlet 121) is represented by arrow 614 in FIG. 5.

An inlet plane 626 is defined as a plane which is tangential to the inlet face 622 at a given location between the top wall 616 and the bottom wall 618 of the duct 610. The inlet plane 626 has an inlet plane normal 627. In some examples, the inlet plane 626 may be defined as a plane which is tangential to the inlet face 622 at a centreline of the duct 610. Similarly, an outlet plane 628 is defined as a plane which is tangential to the outlet face 624 at a given location between the top wall 616 and the bottom wall 618 of the duct 610. The outlet plane 628 has an outlet plane normal 629. In some examples, the outlet plane 628 may be defined as a plane which is tangential to the outlet face 624 at a centreline of the duct 610.

In the example of FIG. 5, both the inlet face 622 and the outlet face 624 are substantially planar two-dimensional faces. In other words, the inlet face 622 and the outlet face 624 are planes. As a result, the inlet plane 626 in this example is coplanar with the inlet face 622 and the outlet plane 628 is coplanar with the outlet face 624. However, it will be appreciated that in other examples, either the inlet face 622 or the outlet face 624 may be non-planar two-dimensional faces. In other words, either the inlet face 622 or the outlet face 624 may be curved two-dimensional surfaces, such that the respective face 622 is not coplanar with the respective plane.

An axial position of the inlet face 622 is defined as a distance, along the axial direction 182, between the inlet face 622 at a given point along the height direction 184 and an upstream end of the inlet face 622. Conversely, an axial position of the outlet face 624 is defined as a distance, along the axial direction 182, between the outlet face 624 at a given point along the height direction 184 and an upstream end of the outlet face 624. In the example, the inlet face 622 is planar such that the axial position of the inlet face 622 varies continuously, and linearly, from the top wall 616 to the bottom wall 618. In the same way, in this example, the outlet face 624 is planar such that the axial position of the outlet face 624 varies linearly from the top wall 616 to the bottom wall 618.

A length 621 of the heat exchanger 620 (that is, a heat exchanger length 621) is defined as a minimum distance between the inlet face 622 and the outlet face 624, at a given point in the height direction 184. In use, a resistance to the flow of fluid 612, 614 through the heat exchanger 620, and therefore a pressure drop across the heat exchanger 620 (e.g. a difference between the static pressure of the flow of air 612 at the inlet face 622 and the static pressure of the flow of air 614 at the outlet face 624), is substantially dictated by skin friction within the heat exchanger 620. In turn, skin friction within the heat exchanger 620 is dependent on the heat exchanger length 621. Therefore, the pressure drop across the heat exchanger 620 is dependent on the heat exchanger length 620.

In this example, the heat exchanger 620 comprises a plurality of fins 630. The fins 630 are configured to increase the internal surface area of the heat exchanger 620 and/or increase a local heat transfer coefficient between the flow of fluid 612, 614 conveyed by the duct 610 and the heat exchanger 620 (e.g., by locally inciting turbulence) and thereby promote heat exchange between the flow of fluid 612, 614 and the heat exchanger 630. Each of the plurality of fins 630 are radially offset with respect to one another in the height direction 184 and extend in a direction which has a component in the axial direction 182 and a component in the height direction 184. A fin density 631 is defined by a minimum distance between adjacent fins 630. A high fin density (that is, a small minimum distance between adjacent fins 630) is associated with an increased internal surface area of the heat exchanger 620 and/or an increased local heat transfer coefficient between the flow of fluid 612, 614 conveyed by the duct 610 and the heat exchanger 620. However, a high fin density is also associated with a larger pressure drop across the heat exchanger 620.

In this example, the heat exchanger 620 is inclined with respect to the axial direction 182 such that at least one of the inlet plane normal 627 and the outlet plane normal 629 has a component in the height direction 184. In the example of FIG. 5, both the inlet plane normal 627 and the outlet plane normal 629 have respective components in the height direction 184. In this example, the inlet face 622 may be described as being inclined with respect to the axial direction 182. Likewise, the outlet face 624 may be described as being inclined with respect to the axial direction 182. In other examples, the inlet face 622 and the outlet face 624 may not be inclined with respect to the axial direction. In other words, the inlet face and the outlet face may have respective inlet plane normal 627 and/or outlet plane normal 629 being parallel to the axial direction 182.

Inclining the inlet face 622 and/or the outlet face 624 of the heat exchanger 620 with respect to the axial direction 182 reduces the heat exchanger radial height 623. A reduced heat exchanger radial height 623 is associated with a reduced height of the heat exchanger assembly 601 as a whole, which is in turn associated with reduced weight and drag of the propulsion system 10 in which the heat exchanger assembly 610 is incorporated. In particular, inclining the heat exchanger 620 with respect to the axial direction 182 allows the internal surface area of the heat exchanger 620 to be enlarged, thereby increasing its heat exchange capacity, without significantly increasing the coefficient of drag of the propulsion system 10.

In the example of FIG. 5, the heat exchanger 620 is inclined in a first inclination direction. The heat exchanger 620 being inclined in the first inclination direction means that the inlet face 622 is further upstream within the duct 610 at the bottom wall 618 than at the top wall 616 and/or that the outlet face 622 is further upstream within the duct 610 at the bottom wall 618 than at the top wall 616.

A bottom downstream region may be defined as a region downstream of the inlet face 622 of the heat exchanger 620 and proximal to the bottom wall 618 while a top downstream region is defined as a region downstream of the inlet face 622 of the heat exchanger 620 and proximal to the top wall 616. As can be seen from FIG. 5, the bottom wall 618 adjacent to the bottom downstream region has a generally concave internal geometry and the top wall 616 adjacent to the bottom downstream region has a generally convex internal geometry.

In the first example heat exchanger assembly 601, the heat exchanger length 621 varies along the height direction 184 with the heat exchanger length 621 being smaller at the bottom wall 618 than at the top wall 616 and the fin density 631 continually increases along the height direction 184 from the bottom wall 618 to the top wall 616 of the duct 610.

In use, the heat exchanger 620 being inclined in the first inclination direction results in the flow of air 612 generally being encouraged toward the top wall 616 when flowing from the duct inlet 111 along the axial direction 182 as the flow of air 612 arrives at the inlet face 622 at the bottom wall 618 first. This tends to relatively increase the mass-flow rate of the flow of air 612 through the inlet face 622 adjacent to the top wall 616 while relatively reducing the mass-flow rate of the flow of air 612 through the inlet face 622 adjacent to the bottom wall 618, thereby increasing the static pressure at the bottom wall 618 relative to the top wall 616. The fins 630 extending generally perpendicular to the inlet face 622 causes the flow of fluid through the heat exchanger 620 to change direction from the axial direction between the inlet face 622 and the outlet face 624, thereby decelerating the flow of fluid and increasing the static pressure of the fluid across the inlet face 622.

Further, the generally concave internal geometry of the bottom wall 618 at the outlet face 624 tends to result in further deceleration of the flow of fluid 614 in the bottom downstream region as the flow of fluid is forced to change direction again. This causes a corresponding increase in static pressure in the bottom downstream region, whereas the generally convex internal geometry of the top wall 616 at the outlet face 624 adjacent to the top downstream region results in less significant deceleration of the flow of fluid 614, and therefore has a correspondingly smaller increase in static pressure. Accordingly, the static pressure of the flow of fluid 614 at the bottom wall 618 may tend to be greater than the static pressure of the flow of fluid 614 at the top wall 616 in the duct 610.

The difference in static pressure and/or the differences in local mass-flow rates at the inlet face 622 along the height direction 184 may lead to significant variations in fluid flow within the duct 610 downstream of the heat exchanger 620, which would result in local flow accelerations in the duct 610 downstream of the heat exchanger 620, which in turn may result in high local Mach numbers downstream of the heat exchanger 620. High Mach numbers are undesirable as they result in pressure losses within the duct and other aerodynamic problems associated with highly compressible fluid flow within a heat exchanger assembly.

By varying the heat exchanger length 621 so that that the heat exchanger length 621 is smaller at the bottom wall 618 than at the top wall 616, the difference between the static pressure of the flow of fluid at the inlet face 622 and the static pressure of the flow of fluid at the outlet face 624 along the height direction 184 may be tuned to relatively reduce the static pressure of the fluid in the bottom downstream region and to relatively increase the static pressure of the fluid in the top downstream region, to thereby equalize the static pressure along the height direction 184 downstream of the heat exchanger 620. Further, by varying the fin density 631 so that the fin density 631 continually increases along the height direction 184 from the bottom wall 618 to the top wall 616 of the duct 610, the difference between the static pressure of the fluid at the inlet face 622 and the static pressure of the fluid at the outlet face 624 along the height direction 184 may be tuned to further relatively reduce the static pressure of the flow of fluid in the bottom downstream region and to further relatively increase the static pressure of the flow of fluid in the top downstream region. This may at least partially eliminate (e.g., mitigate) static pressure variations immediately downstream of the outlet face 624 of the heat exchanger 620 and thereby reduce pressure losses within the duct of the heat exchanger assembly 601 due to such static pressure variations, leading to better performance of the propulsion system 10.

Figure 6:
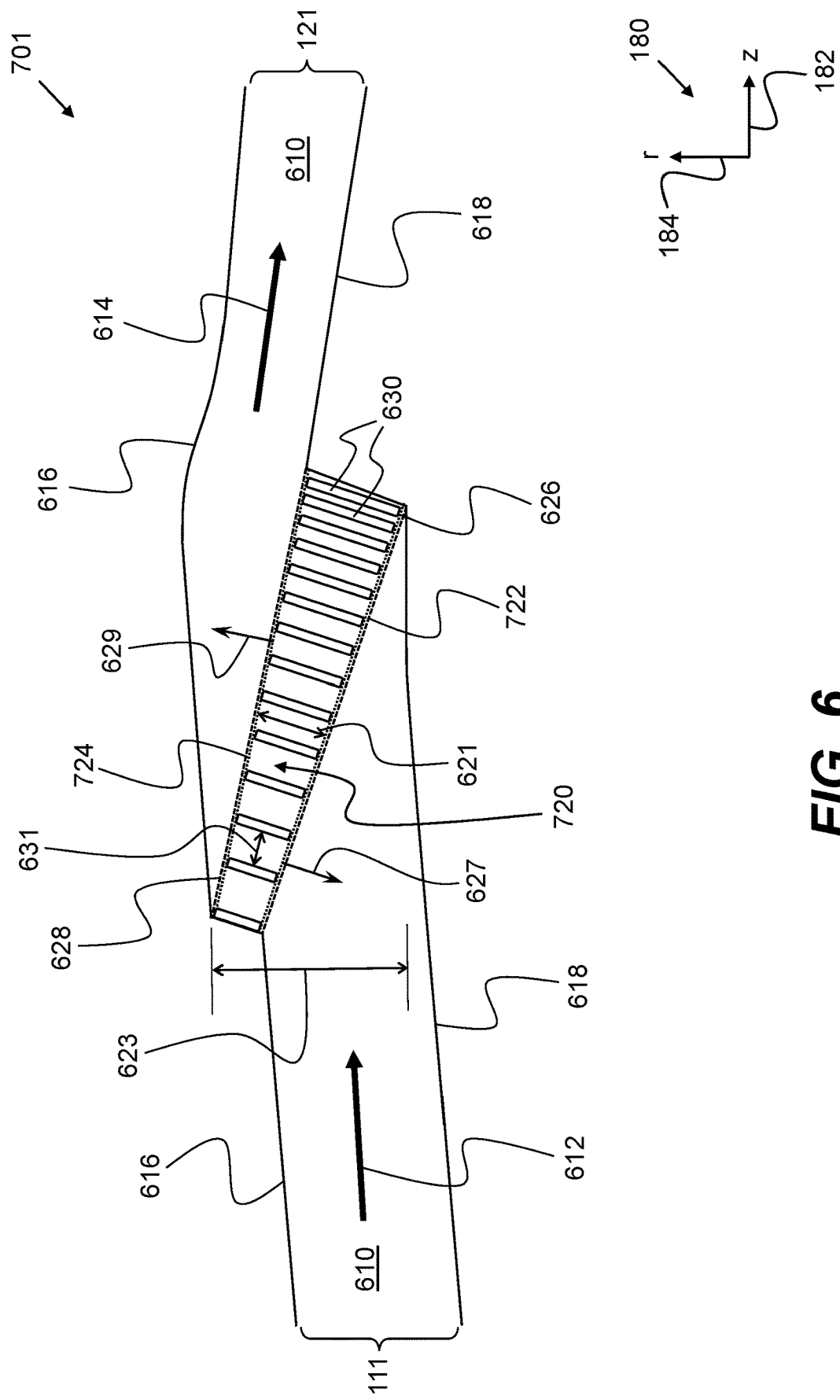
FIG. 6 is a cross-sectional view of a second example heat exchanger assembly.

FIG. 6 is a cross-sectional view of a second example heat exchanger assembly 701 suitable for use within a propulsion system 10 as described herein. The second example heat exchanger assembly 701 is similar to the first example heat exchanger assembly 601 described above with reference to FIG. 5, with like reference numerals indicating common or similar features.

The heat exchanger assembly 701, in the example of FIG. 6, differs from the heat exchanger assembly 601 in the example of FIG. 5 in that it is essentially a mirror image along the axial direction, such that comprises a heat exchanger 720 which is inclined in a second inclination direction, in which an inlet face 722 of the heat exchanger 720 is further downstream within the duct 610 at the bottom wall 618 than at the top wall 616 and/or that the outlet face 724 is further downstream within the duct 610 at the bottom wall 618 than at the top wall 616.

The second example heat exchanger assembly 701 therefore also differs in that the heat exchanger length 621 varies along the height direction 184 with the heat exchanger length 621 being longer at the bottom wall 618 than at the top wall 616 and the fin density 631 continually decreases along the height direction 184 from the bottom wall 618 to the top wall 616 of the duct 610.

By varying the heat exchanger length 621 so that that the heat exchanger length 621 is longer at the bottom wall 618 than at the top wall 616, the difference between the static pressure of the flow of fluid at the inlet face 722 and the static pressure of the flow of fluid at the outlet face 724 along the height direction 184 may be tuned to relatively increase the static pressure of the fluid in the bottom downstream region and to relatively reduce the static pressure of the fluid in the top downstream region. Additionally, by varying the fin density 631 so that the fin density 631 continually decreases along the height direction 184 from the bottom wall 618 to the top wall 616 of the duct 610, the difference between the static pressure of the fluid at the inlet face 722 and the static pressure of the fluid at the outlet face 724 along the height direction 184 may be tuned to further relatively reduce the static pressure of the flow of fluid in the bottom downstream region and to further relatively increase the static pressure of the fluid in the top downstream region.

In each of the example heat exchanger assemblies 601, 701 described herein, the heat exchanger length 621 varies along the height direction 184. In particular, in these examples, the heat exchanger length 621 varies in correspondence with the axial position of the inlet face 622, 722. Further, in each of the example heat exchanger assemblies 601, 701 described herein the fin density 631 varies along the height direction 184 and in particular, the fin density 631 varies in correspondence with the axial position of the inlet face 622, 722. For example, the heat exchanger length 621 (and optionally the fin density 631) may vary such that the heat exchanger length 621 (and the fin density 631, if applicable) increases where the axial position of the inlet face 622, 722 along the height direction 184 is further downstream, and decreases where the axial position of the inlet face 622, 722 is further upstream.

In both the example heat exchanger assemblies 601, 701 described herein, the heat exchanger length 621, and optionally the fin density 631, varies along the height direction 184 such that a resistance to the flow of fluid 612, 614 through the heat exchanger 620 varies along the height direction 184. Consequently, in both the example heat exchanger assemblies 601, 701, the heat exchanger length 621, and optionally the fin density 631, varies along the height direction 184 such that, when the flow of air 612, 614 is conveyed by the duct 610 a difference between the static pressure of the flow of air 612 at the inlet face 622, 722 and the static pressure of the flow of air 614 at the outlet face 624, 724 varies along the height direction.

In the preceding description, it has been described that the fin density 631 varies along the height direction 184, but this need not necessarily be the case. That is, it may be that only the heat exchanger length 621 varies along the height direction 184.

Further, although it has been described that the heat exchanger 620, 720 comprises a plurality of fins 630 (e.g., the heat exchanger 620, 720 is a fin-and-plate type heat exchanger), this disclosure envisages that the heat exchanger 620 may not comprise a plurality of fins. For example, it may be that the heat exchanger instead comprises other features which are configured to increase the internal surface area of the heat exchanger 620, 720, such as pins, tubes, channels and the like. If present, at least one of the fins 630 may be configured to convey a flow of process fluid therethrough, such as oil.

Further, the preceding description refers to specific types of static pressure variations which may arise due to factors discussed above and which may be addressed by varying the manner in which the heat exchanger length 621 varies along the height direction 184. However, in other example heat exchanger assemblies, other types of flow maldistribution profiles may be liable to arise due to other factors including, but not limited to, the internal geometry of the duct 610 upstream of the heat exchanger 520 and/or viscous effects within the duct 610. The heat exchanger length 621 and optionally the fin density 631 may be varied along the height direction 184 so as to appropriately tune the resistance to the flow of fluid 612, 614 through the heat exchanger 620, 720 and thereby mitigate any potential flow maldistribution profile. To this end, the heat exchanger length 621 may vary along the height direction 184 so that the heat exchanger length 621 is substantially equal at the bottom wall 618 and the top wall 616, but wherein the heat exchanger length 621 is greatest at a location between the respective walls 616, 618. If so, the heat exchanger length 621 may vary along the height direction 184 according to, for example, a non-linear function such as a parabolic function, a hyperbolic function or a trigonometric function.

It will be understood that the disclosure is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

What is claimed is:

1. A propulsion system having an axial direction relating to a principal direction of propulsion, and a height direction perpendicular to the axial direction, the propulsion system comprising:

a duct configured to convey a flow of fluid along the axial direction; and a heat exchanger disposed within the duct, wherein the heat exchanger is defined between an inlet face and an outlet face and is configured to convey the flow of fluid from the inlet face to the outlet face;

wherein a heat exchanger length is defined as a minimum distance between the inlet face and the outlet face, and wherein the heat exchanger length varies along the height direction such that a resistance to the flow of fluid through the heat exchanger varies along the height direction, wherein the duct comprises a top wall and a bottom wall, spaced apart along the height direction, with the heat exchanger extending from the top wall to the bottom wall, wherein the inlet face and the outlet face extend linearly at an angle relative to the axial direction from the top wall to the bottom wall of the duct, wherein the inlet face of the heat exchanger is further upstream within the duct at the bottom wall than at the top wall, and wherein the heat exchanger length varies along the height direction, with the heat exchanger length being smaller at the bottom wall than at the top wall.

2. The propulsion system of claim 1, wherein a normal to an inlet plane which is tangential to the inlet face has a component in the height direction.

3. The propulsion system of claim 1, wherein a normal to an outlet plane which is tangential to the outlet face has a component in the height direction.

4. The propulsion system of claim 2, wherein an axial position of the inlet face varies along the height direction; wherein the heat exchanger length varies along the height direction, in correspondence to the axial position of the inlet face.

5. The propulsion system of claim 1, wherein the heat exchanger comprises a plurality of fins radially offset from one another and extending with a component in the axial direction.

6. The propulsion system of claim 5, wherein a fin density is defined as a minimum distance between adjacent fins, and the fin density varies along the height direction.

7. The propulsion system of claim 4, wherein the heat exchanger comprises a plurality of fins radially offset from one another and extending with a component in the axial direction, a fin density is defined as a minimum distance between adjacent fins, the fin density varies along the height direction, and the fin density continually increases along the height direction from the bottom wall to the top wall of the duct.

8. The propulsion system of claim 1, wherein the propulsion system is a gas turbine engine.

9. The propulsion system of claim 8, wherein an inlet of the duct is configured to receive a flow of air from a bypass duct of the gas turbine engine, and wherein the duct is configured to convey the flow of air from the inlet to an outlet, through the heat exchanger.

10. The propulsion system of claim 1, wherein the propulsion system includes an electric motor.

11. An aircraft comprising the propulsion system of claim 1.

* * * * *